United States Patent [19]

Randell

[11] Patent Number: 4,553,096
[45] Date of Patent: Nov. 12, 1985

[54] NUCLEAR MAGNETIC RESONANCE METHOD AND APPARATUS

[75] Inventor: Christopher P. Randell, London, England

[73] Assignee: Picker International Limited, Wembley, England

[21] Appl. No.: 515,356

[22] Filed: Jul. 19, 1983

[30] Foreign Application Priority Data

Jul. 28, 1982 [GB] United Kingdom ............... 8221852

[51] Int. Cl.$^4$ .................................... G01R 33/08
[52] U.S. Cl. ............................................. 324/309
[58] Field of Search ............... 324/300, 307, 309, 314

[56] References Cited

U.S. PATENT DOCUMENTS

| | | | |
|---|---|---|---|
| 4,339,716 | 7/1982 | Young ..................... | 324/309 |
| 4,355,282 | 10/1982 | Young et al. ............ | 324/309 |
| 4,431,968 | 2/1984 | Edelstein et al. ........ | 324/309 |
| 4,468,621 | 8/1984 | Hinshaw ................. | 324/309 |
| 4,484,138 | 11/1984 | Bottomley et al. ...... | 324/309 |

FOREIGN PATENT DOCUMENTS 2091884A 8/1982 United Kingdom .

Primary Examiner—Ernest F. Karlsen
Assistant Examiner—Kevin D. O'Shea
Attorney, Agent, or Firm—Watts, Hoffmann, Fisher & Heinke Co.

[57] ABSTRACT

A method and apparatus for determining the spatial distribution of the chemical shift spectra of a chosen element across a region of a body. Where the region is a slice, nuclear magnetic resonance for the element is excited preferentially in the slice. First and second pulsed magnetic gradient fields (Gx, Gy) having magnetic field gradients in first and second mutually orthogonal directions in the plane of the slice are applied. The value of the gradient of the first field is stepped through a range of first values, for each of the first values the gradient of the second field being stepped through a range of second values. The free induction decay signal after each set of one first and second field pulses is measured to form a set of free induction decay signals which is subjected to a two dimensional Fourier Transform process with respect to the first and second directions, and to an additional Fourier Transform process with respect to time to obtain chemical shift spectra for the element at each of a plurality of different locations in the slice.

6 Claims, 6 Drawing Figures

NUCLEAR MAGNETIC RESONANCE METHOD AND APPARATUS

This invention relates to methods and apparatus for determining the spatial distribution in a body of the chemical shift spectra for a chosen element by nuclear magnetic resonance (NMR) imaging.

By "chemical shift" is meant the relatively small shift in the Larmor frequency of a nucleus which is caused by electrons screening the nucleus from an applied magnetic field. The exact shielding caused by the electrons depends on the chemical environment of the nucleus, and thus differs for an element in different chemical compounds. NMR techniques have been used to measure chemical shifts for various elements for many years.

More recently NMR techniques have been used to obtain images representing the spatial distribution over a region of a body of a chosen quantity, e.g. the density of a chosen nuclei, for example hydrogen protons, or of NMR spin relaxation time constants. Such distributions are similar to, although of different significance from, the distributions of X-ray attenuation provided by computerised tomography systems.

To date chemical shifts have been largely ignored in the NMR imaging process. Recent developments however, particularly in the study of $^{31}P$, a nucleus exhibiting comparatively large chemical shifts, indicate that NMR imaging of the spatial distribution of chemical shift spectra over a body can be a useful tool in the study of individual molecular species in a body.

It is an object of the present invention to provide a method of NMR imaging wherein information about the spatial distribution of chemical shift spectra over a region of a body is obtained, and also to provide apparatus arranged to perform such a method.

According to a first aspect of the present invention a method of determining the spatial distribution of the chemical shift spectra of a chosen element across a slice of a body comprises: exciting nuclear magnetic resonance for said element preferentially in said slice of said body; applying first and second pulsed magnetic gradient fields having magnetic field gradients in first and second mutually orthogonal directions in the plane of said slice to produce phase dispersion in said resonance along said first and second directions respectively; stepping the value of the gradient of said first field through a range of first values, for each of said first values stepping the value of the gradient of said first field through a range of first values, for each of said first values stepping the value of the gradient of said second field through a range of second values and measuring the free induction decay signal after each set of one first and second field pulses to form a set of free induction decay signals; subjecting said set of signals to a two dimensional Fourier Transform process with respect to said first and second directions, and to an additional Fourier Transform process with respect to time to obtain chemical shift spectra for said chosen element at each of a plurality of different locations in said slice.

According to a second aspect of the present invention a method of determining the spatial distribution of the chemical shift spectra of a chosen element over a volume within a body comprises: exciting nuclear magnetic resonance for said element within said volume; applying first, second and third pulsed magnetic gradient fields having magnetic field gradients within said volume in first, second and third mutually orthogonal directions to produce phase dispersion in said resonance along said first, second and third directions respectively; stepping the value of the gradient of said first through a range of first field values, for each value of said first field values stepping the value of the gradient of said second field through a range of second values, and for each value of said second values stepping the value of the gradient of said third field through a range of third values, and measuring the free induction decay signal after each set of one first, second and third field pulses to form a set of free induction decay signals; subjecting said set of signals to a three dimensional Fourier Transform process, and to an additional Fourier Transform process with respect to time to obtain chemical shift spectra for said chosen element at each of a plurality of different locations in said volume.

In a method according to either aspect of the invention preferably after each step a magnetic field pulse is applied which is effective to cause spin echos.

The invention also provides apparatus arranged carry out a method according to the first aspect of the present invention, comprising: means arranged to excite nuclear magnetic resonance for said element preferentially in said slice of said body; means arranged to apply first and second pulsed magnetic gradient fields having magnetic field gradients in first and second mutually orthogonal directions in the plane of said slice; means for stepping the value of the gradient of said first field through a range of first values; means for stepping the value of the gradient of said second field through a range of second values for each of said first values; means for measuring the free induction decay signal after each set of one first and second field pulses to form a set of free induction decay signals; and means for subjecting said set of signals to a two dimensional Fourier Transform process with respect to said first and second direction, and to an additional Fourier Transform process with respect to time.

The invention further provides apparatus arranged to carry out a method according to the second aspect of the present invention, comprising: means for exciting nuclear magnetic resonance for said element within said volume; means for applying first, second and third pulsed magnetic gradient fields having magnetic field gradients within said volume in first, second and third mutually orthogonal directions; means for stepping the value of the gradient of said first field through a range of first values; means for stepping the value of the gradient of said second field through a second range of second values for each value of said first value; means for stepping the value of the gradient of said third field through a range of third values for each value of said second value; means for measuring the free induction decay signal after each set of one first, second and third field pulses to form a set of free induction decay signals; means for subjecting said set of signals to a three dimensional Fourier Transform process, and to an additional Fourier Transform process with respect to time.

Four methods of NMR imaging and apparatus in accordance with the invention will now be described, by way of example only, with reference to the accompanying drawings in which.

The methods are performed using apparatus similar to that described in U.K. Patent Specification No. 1,578,910 or No. 2,056,078, to which reference should be made for a fuller description, appropriately programmed to apply a sequence of magnetic field gradient and RF pulses and analyse the resulting signals as hereafter described.

The essential features of such an apparatus in so far as is required for an understanding of the present invention are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
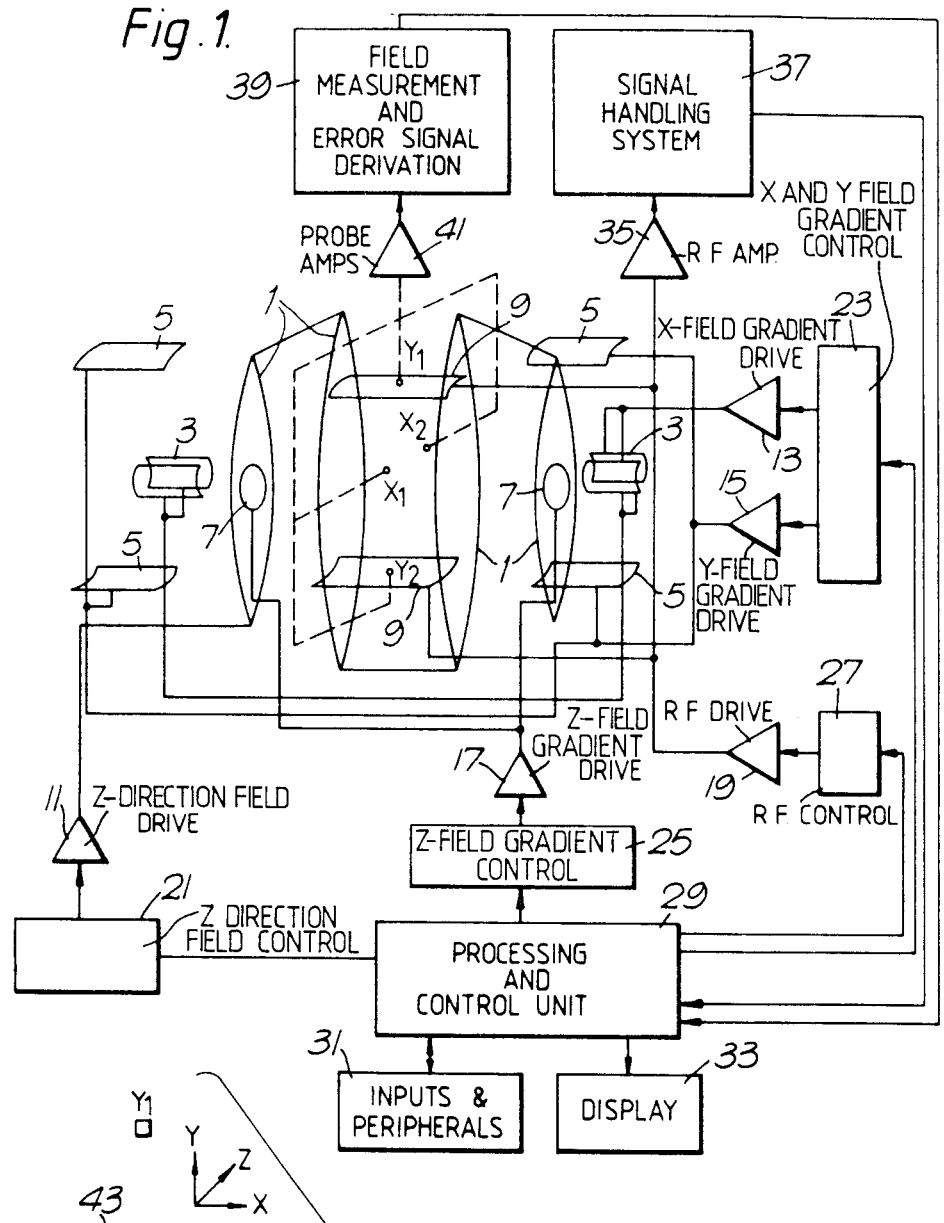
FIGS. 1 and 2 illustrate the apparatus diagramatically.

Referring to FIG. 1, the first coil system comprises coils 1 capable of providing a steady uniform magnetic field in the Z direction; coils 3 capable of providing a magnetic field gradient in the X direction, coils 5 capable of providing a magnetic field gradient in the Y direction; and coils 7 capable of providing a magnetic field gradient in the Z direction.

In addition, the apparatus includes a second coil system 9 whereby RF magnetic fields can be applied to the body under examination in a plane normal to the direction of the steady uniform magnetic field produced by the first coil system, and whereby RF magnetic fields resulting from nuclei in the body under examination which have been excited to nuclear magnetic resonance with a spin vector component other than in the Z direction can be detected.

In the drawing a single pair of coils 9 is shown for both applying and detecting RF fields, but in certain circumstances it may be preferable to provide separate coils for detecting the RF fields.

The various coils 1, 3, 5, 7 and 9 are driven by drive amplifiers 11, 12, 13, 15, 17 and 19 respectively, controlled by control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

Figure 2:
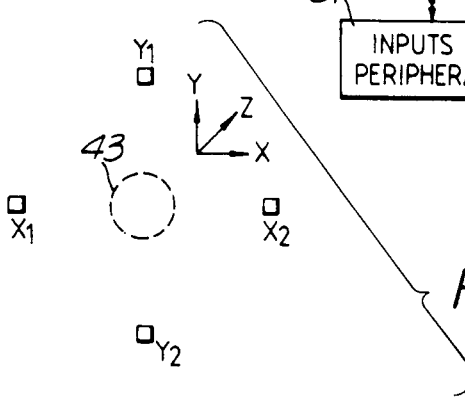

The apparatus also includes field measurement and error signal circuits 39 which receive signals via amplifiers 41 from field probes $X_1$, $X_2$, $Y_1$ and $Y_2$ which are disposed at suitable positions in relation to a slice 43 of the body being examined, as illustrated in FIG. 2, to monitor the applied magnetic fields.

Figure 3:
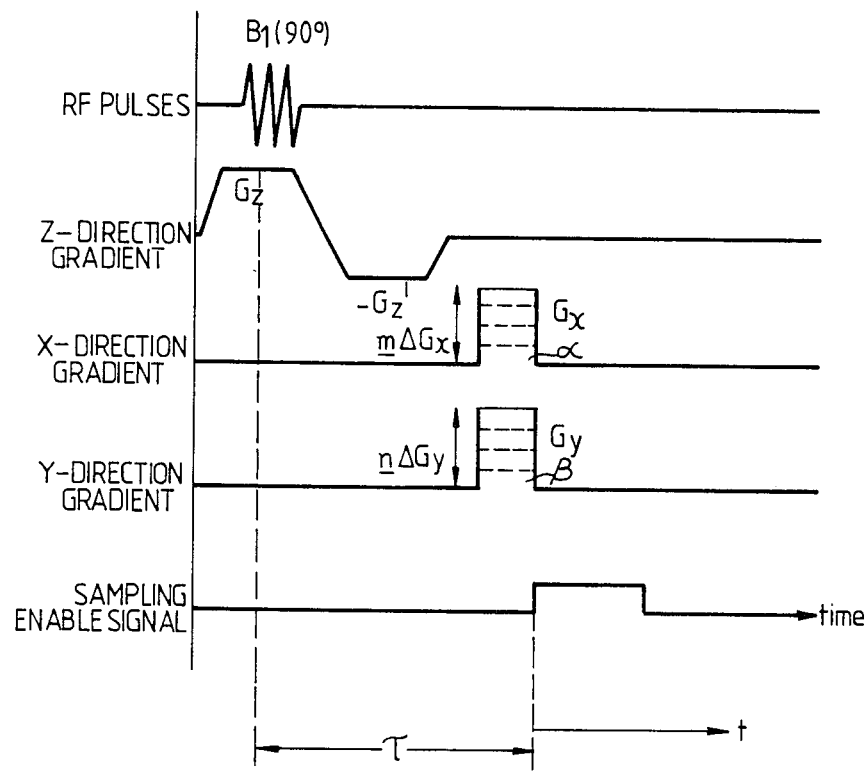
FIG. 3 illustrates the magnetic field sequence employed in the first method.

Referring now also to FIG. 3, in operation of the apparatus a steady uniform magnetic field Bo is applied to the body under examination in the Z direction. This field serves to define the equilibrium axis of magnetic alignment of the nuclei in the body i.e. along the Z-direction, and remains constant throughout the examination procedure. A magnetic gradient field having a gradient $G_z$ along the Z-direction is then applied to the body, together with an RF magnetic field pulse denoted $B_1(90°)$, for reasons explained hereafter. The frequency of the RF field is chosen to be the Larmor frequency for phosphorus nuclei in a slice of the body, normal to the Z-direction defined by a particular magnetic field along the Z direction, such that phosphorus nuclei within the slice are preferentially excited. The integral of the RF pulse is such that the pulse is just sufficient to tip the spins of the excited phosphorus nuclei into the X-Y plane, and is thus referred to as a 90° pulse, the spins then precessing in the X-Y plane round the Z axis.

The gradient Gz is then removed, and replaced by a gradient in the opposite sense -Gz'. This causes the rephasing of the spins which have been selectively excited by the combination of the RF pulse $B_1(90°)$, Bo and the gradient Gz, the dephasing having been caused by the gradient through the slice. The magnitude of -Gz' is adjusted so that the spins are rephased at the time at which this gradient is switched off as described, for example, in the above mentioned U.K. Patent Specification No. 1,578,910.

Pulsed magnetic gradient fields having gradients Gx, Gy are then simultaneously imposed along the two mutually orthogonal directions X and Y in the plane of the slice of the body. These pulses cause a phase dispersion of the phosphorus nuclei spins in the slice along both the X and Y directions. After the Gx and Gy pulses, the signal induced in the second coil system by the phosphorus nuclei spins in the slice, i.e. the Free Induction Decay (F.I.D.) signal, is recorded.

The whole pulse sequence i.e. $B_1(90°)$ and Gz, -Gz', Gx and Gy is then repeated for different values of the amplitude of Gx and Gy, the duration of the pulses being kept constant, and the F.I.D. signal being measured after each pulse sequence. In the course of this set of pulse sequences, the value of the gradient of the Gx pulses is sequentially stepped through the range $m\Delta Gx$ where m varies from 0 to M−1; for each value of the gradient of Gx, the value of the gradient of the Gy pulse is stepped through the range $m\Delta Gy$ where m varies from 0 to N−1. the object being to divide the slice ultimately into N×M pixels.

After all the pulses have been applied, the total N×M sets of data stored within the processing and control unit 29 contain information about both the position within the slice (x,y), and the chemical shift structure ($\nu$) of the NMR signals from the slice. For each set of data the signal from a point (x,y) in the slice is a function $s(\alpha, \beta, x, y, t)$ where $\alpha$ and $\beta$ are the areas under each pulse Gx, Gy for each value of n and m respectively, and t is the time which has elapsed since the end of the Gx, Gy pulses. The function $s(\alpha, \beta, x, y, t)$ may be expressed:

$$s(\alpha,\beta,x,y,t) = \int \nu \{\exp i(\alpha\gamma x + \beta\gamma y + 2\pi\nu t) \exp-[(\tau+t)/T_2]u(x,y,\nu)\}$$

where $u(x, y, \nu)$ is the chemical shift spectrum for phosphorus nuclei at the point (x,y) in the slice;

$\gamma$ is the nuclear magnetogyric ratio for $^{31}P$ $\tau$ is the time which has elapsed between the $B_1(90°)$ pulse and the end of the Gx and Gy pulses; and $T_2$ is the spin-spin relaxation time for the phosphorous nuclei.

As the signal measured, however, contains contributions from the entire slice, it can be written $s(\alpha, \beta, t)$ where $$s(\alpha,\beta,t) = \int\int\int dxdyd\nu \{\exp i[\alpha x + \beta \gamma y + 2\pi \nu t] \exp-[(\tau+t)/T_2]u(x,y,\nu)\} \quad (1)$$

To evaluate the spatial distribution of the chemical shift spectrum, it is necessary to take a 3 dimensional Fourier Transform of the measured signals for the set of $(\alpha, \beta)$ values, and sampled t values, i.e. obtain $F(w_x, w_y, w_t)$ where $F(w_x)$ is the Fourier Transform with respect to the X direction, $F(w_y)$ is the Fourier Transform with respect to the Y direction, and $F(w_t)$ is the Fourier Transform with respect to time, and $$F(w_x, w_y, w_t) = \int\int\int d\alpha d\beta dt \{\exp - i[\alpha w_x + \beta w_y + t w_t]\} \cdot s(\alpha,\beta,t)$$

Substituting from equation (1), one obtains:

$$F(w_x, w_y, w_t) = \int\int\int dxdyd\nu(x,y,\nu)\{\int d\alpha \exp i\alpha(\gamma x - w_x)\}\{\int d\beta \exp i\beta(\gamma y - w_y)\}\{\int dt \exp it(2\pi\nu - w_t) \exp-[(\tau+t)/T_2]\} \quad (2)$$

Using the following identities:

$$\int_{-\infty}^{\infty} d\alpha \exp i\alpha (\gamma x - w_x) = \delta(\gamma x - w_x)$$

$$= \gamma\delta\left(x - \frac{w_x}{\gamma}\right)$$

$$\int_{-\infty}^{\infty} d\beta \exp i\beta (\gamma y - w_y) = \delta(\gamma y - w_y)$$

$$= \gamma\delta\left(y - \frac{w_y}{\gamma}\right)$$

i.e., Dirac delta functions, centred at $x = w_x/\gamma$, $y = w_y/\gamma$ respectively, which can be assumed for an ideal case, although in practice truncation and sampling effects will degrade the X and Y resolution.

$$\int_0^{\infty} dt \exp i(t(2\pi\nu - wt)) \exp -\left[\frac{\tau+t}{T_2}\right] =$$

$$\exp-\left[\frac{\tau}{T_2}\right]\left\{\frac{1}{\left(\frac{1}{T_2}\right) - i(2\pi\nu - w_t)}\right\} =$$

$$\frac{\exp-\left[\frac{\tau}{T_2}\right]\left(\frac{1}{T_2}\right)}{\left(\frac{1}{T_2}\right)^2 + (2\pi\nu - w_t)^2} +$$

$$\frac{i \exp-\left[\frac{\tau}{T_2}\right](2\pi\nu - w_t)}{\left(\frac{1}{T_2}\right)^2 + (2\pi\nu - w_t)^2} =$$

$$\exp-\left[\frac{\tau}{T_2}\right] G (2\pi\nu - w_t)^2$$

where $G(2\pi\nu - w_t)^2$ is a complex line shape function of Laurentian type.

Substituting these identities into Equation (2)

$$F(w_x, w_y, w_t) = \gamma^2 \exp-\left[\frac{\tau}{T_2}\right] \int\int\int dxdyd\nu \Bigg( u(x,y,\nu)$$

$$\delta\frac{(x - w_x)}{\gamma} \delta\frac{(y - w_y)}{\gamma} G (2\pi\nu - w_t)^2 \Bigg) =$$

$$\gamma^2 \exp-\left[\frac{\tau}{T_2}\right] \int d\nu \, u\left(\frac{w_x}{\gamma}, \frac{w_y}{\gamma}, \nu\right) G (2\pi - w_t)^2$$

Thus this expression represents a measurement of the chemical spectrum at the point $x = w_x/\gamma$, $y = w_y/\gamma$ about the frequency $\nu = w_t/2\pi$, and it is therefore possible to take a two dimensional Fourier transform of the data $s(\alpha, \beta, t)$ with respect to the two orthogonal directions X and Y to obtain a frequency distribution for the N×M pixels within the slice. A further Fourier Transform with respect to time will yield the chemical spectrum for phosphorus within each pixel.

In practice typically the slice will be divided into 8×8 pixels, this being a compromise between spatial resolution, and the necessity to achieve an adequate signal from an element such as phosphorus which may be present in only small quantities in the body. The information thus derived may be displayed by any convenient means, such as on the display 33.

Figure 4:
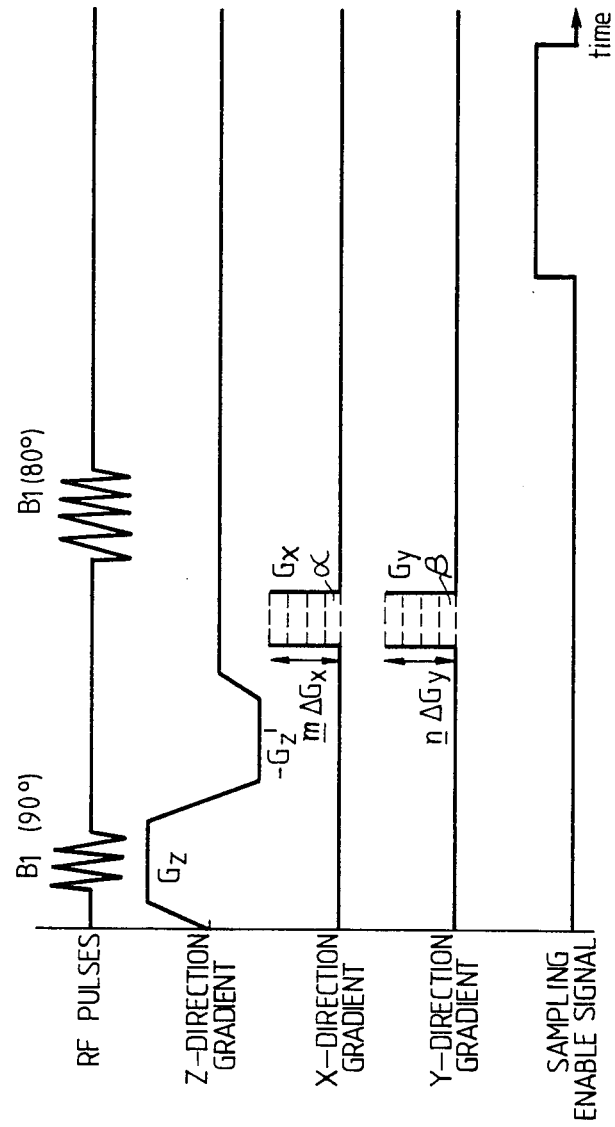
FIG. 4 illustrates the magnetic field sequence employed in the second method.

Referring now to FIG. 4, the second method to be described is an adaptation of the first method. After each pulse of Gx and Gy there is applied an additional RF pulse, of the same frequency as $B_1(90°)$, sufficient to cause rotation of the phosphorus nuclei spins within the slice by 180°, and thus referred to as $B_1(180°)$. The spins in the xy plane which have been precessing round the Z axis and have subsequently dephased are caused to rephase to give a rephasing signal, or "spin echo", which is a mirror image of an F.I.D. signal. Recording the spin echos, rather than the F.I.D. signals as in the first method, allows further time in which to collect the nuclear magnetic resonance signal after each pulse of Gx and Gy. This reduces the need for very rapid magnetic field switching, with its inherent problem of Eddy currents.

Figure 5:
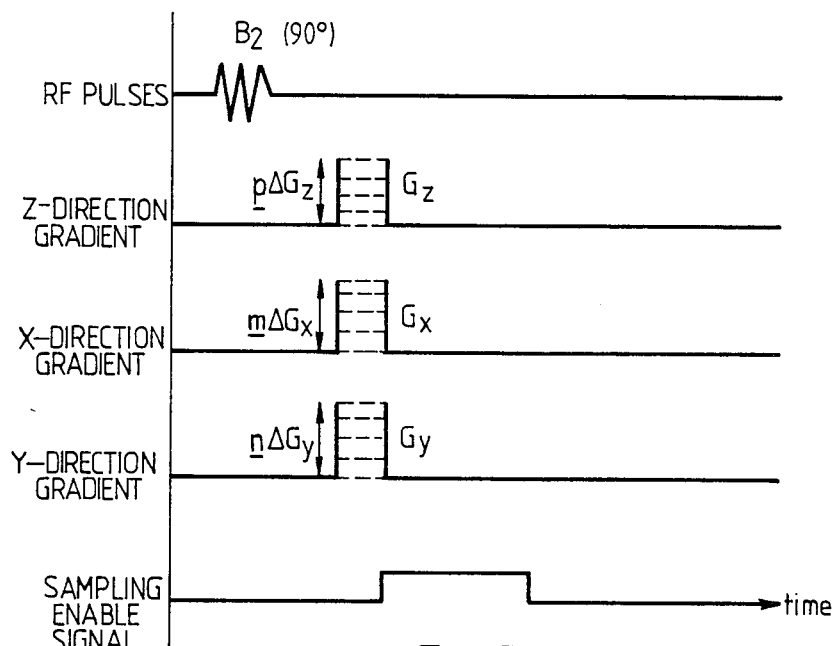
FIG. 5 illustrates the magnetic field sequence employed in the third method.

The third method to be described is an extension of the first method into three dimensions, such that a volume element within the body may be examined, rather than a slice. Consequently the same magnetic fields will be denoted by the same references as in the previous two methods. Referring to FIG. 5, the steady field Bo along the Z-direction is again applied to the body under examination, and an RF pulse $B_2(90°)$ is applied at the Larmor frequency for phosphorus nuclei at the value of the field Bo. As no gradient fields are applied during this pulse, this pulse serves to excite all the phosphorus nuclei within the body, and tip their spins into the X-Y planes along the body. The three pulsed gradient fields are then applied simultaneously to cause phase dispersion of the spins along the X, Y and Z directions. In this particular method the value of the gradient of the Gz pulse is also stepped through a range p$\Delta$Gz, where p varies from 0 to P−1, the Gx pulse being stepped through the range m$\Delta$Gx for each value of p, whilst the Gy pulse is stepped through the range n$\Delta$Gy for each value of m. After each set of pulses the F.I.D. signal induced in the second coil system in the phosphorus spins in the body is recorded, and a $B_2(90°)$ pulse applied to recommence the sequence. After all the steps have been performed the total N×M×P sets of data are subjected to a three dimensional Fourier Transform with respect to the three orthogonal directions X, Y and Z, to obtain frequency distributions for each of the N×M×P pixels within the body. A further Fourier Transform, with respect to time, will then yield the chemical shift spectrum for phosphorus within each pixel.

Figure 6:
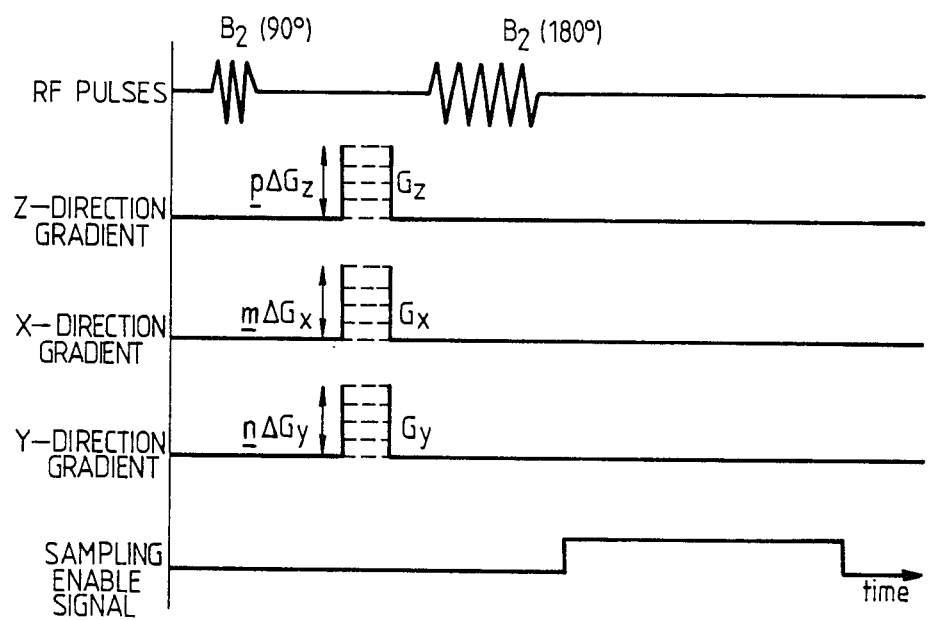
FIG. 6 illustrates the magnetic field sequence employed in the fourth method.

Referring now to FIG. 6, the fourth method to be described is an adaptation of the third method. After each set of pulses of Gx, Gy and Gz, there is applied an additional RF pulse $B_2(180°)$ effective to cause spin echoes, and as in the second method described herebefore, these are recorded in preference to the F.I.D. signals.

It will be appreciated that although all the methods described herebefore relate to obtaining the spatial distribution of chemical shift spectra of phosphorus within a body, the methods are equally applicable to obtaining chemical shift spectra of any other element, by appropriate choice of the RF pulse frequency.

I claim:

1. A method of determining the spatial distribution of the chemical shift spectra of a chosen element across a slice of a body comprising: exciting nuclear magnetic resonance for said element preferentially in said slice of said body; applying first and second pulsed magnetic gradient fields having magnetic field gradients in first and second mutually orthogonal directions in the plane of said slice to produce phase dispersion in said resonance along said first and second directions respectively; stepping the value of the gradient of said first field through a range of first values, for each of said first values stepping the value of the gradient of said second field through a range of second values and measuring the free induction decay signal after each set of one first and second field pulses to form a set of free induction decay signals; subjecting said set of signals to a two dimensional Fourier Transform process with respect to said first and second directions, and to an additional Fourier Transform process with respect to time to obtain chemical shift spectra for said chosen element at each of a plurality of different locations in said slice.

2. A method according to claim 1 in which after each step a magnetic field pulse is applied which is effective to cause spin echoes.

3. A method of determining the spatial distribution of the chemical shift spectra of a chosen element over a volume within a body comprising: exciting nuclear magnetic resonance for said element within said volume; applying first, second and third pulsed magnetic gradient fields having magnetic field gradients within said volume in first, second and third mutually orthogonal directions to produce phase dispersion in said resonance along said first, second and third directions respectively; stepping the value of the gradient of said first field through a range of first field values, for each value of said first field values stepping the value of the gradient of said second field through a range of second values, and for each value of said second values stepping the value of the gradient of said third field through a range of third values, and measuring the free induction decay signal after each set of one first, second and third field pulses to form a set of free induction decay signals; subjecting said set of signals to a three dimensional Fourier Transform process, and to an additional Fourier Transform process with respect to time to obtain chemical shift spectra for said chosen element at each of a plurality of different locations in said volume.

4. A method according to claim 3 in which after each step a magnetic field pulse is applied which is effective to cause spin echoes.

5. An apparatus arranged to perform a method of determining the spatial distribution of the chemical shift spectra of a chosen element across a slice of a body comprising: means arranged to excite nuclear magnetic resonance for said element preferentially in said slice of said body; means arranged to apply first and second pulsed magnetic gradient fields having magnetic field gradients in first and second mutually orthogonal directions in the plane of said slice; means for stepping the value of the gradient of said first field through a range of first values; means for stepping the value of the gradient of said second field through a range of second values for each of said first values; means for measuring the free induction decay signal after each set of one first and second field pulses to form a set of free induction decay signals; and means for subjecting said set of signals to a two dimensional Fourier Transform process with respect to said first and second directions, and to an additional Fourier Transform process with respect to time.

6. An apparatus arranged to perform a method of determining the spatial distribution of the chemical shift spectra of a chosen element over a volume within a body comprising: means for exciting nuclear magnetic resonance for said element within said volume; means for applying first, second and third pulsed magnetic gradient fields having magnetic field gradients within said volume in first, second and third mutually orthogonal directions; means for stepping the value of the gradient of said first field through a range of first values; means for stepping the value of the gradient of said second field through a range of second values for each value of said first value; means for stepping the value of the gradient of said third field through a range of third values for each value of said second value; means for measuring the free induction decay signal after each set of one first, second and third field pulses to form a set of free induction decay signals; means for subjecting said set of signals to a three dimensional Fourier Transform process, and to an additional Fourier Transform process with respect to time.

* * * * *

UNITED STATES PATENT AND TRADEMARK OFFICE
CERTIFICATE OF CORRECTION

PATENT NO. : 4,553,096
DATED : November 12, 1985
INVENTOR(S) : Christopher P. Randell It is certified that error appears in the above-identified patent and that said Letters Patent is hereby corrected as shown below:

Column 2, line 4, after "first" insert --field--;

Column 6, line 3, delete "i" prefacing --exp--.

Signed and Sealed this

Eleventh Day of February 1986

[SEAL]

Attest:

DONALD J. QUIGG

Attesting Officer

Commissioner of Patents and Trademarks